(12) United States Patent
Zhang et al.

(10) Patent No.: US 12,381,543 B2
(45) Date of Patent: Aug. 5, 2025

(54) ULTRAFAST ELECTRIC PULSE GENERATION AND DETECTION DEVICE AND USE METHOD THEREOF

(71) Applicant: BEIHANG UNIVERSITY, Beijing (CN)

(72) Inventors: Boyu Zhang, Beijing (CN); Wenlong Cai, Beijing (CN); Chen Xiao, Beijing (CN); Xiangyu Zheng, Beijing (CN); Jiaqi Wei, Beijing (CN); Weisheng Zhao, Beijing (CN)

(73) Assignee: BEIHANG UNIVERSITY, Beijing (CN)

( * ) Notice: Subject to any disclaimer, the term of this patent is extended or adjusted under 35 U.S.C. 154(b) by 179 days.

(21) Appl. No.: 18/491,989

(22) Filed: Oct. 23, 2023

(65) Prior Publication Data

US 2024/0056065 A1     Feb. 15, 2024

Related U.S. Application Data

(63) Continuation of application No. PCT/CN2021/088955, filed on Apr. 22, 2021.

(51) Int. Cl.
*H03K 5/01*     (2006.01)
*G01J 11/00*    (2006.01)
(Continued)

(52) U.S. Cl.
CPC ............ *H03K 5/01* (2013.01); *G01J 11/00* (2013.01); *G01R 19/00* (2013.01); *G11C 13/04* (2013.01);
(Continued)

(58) Field of Classification Search
CPC .... H03K 5/01; H03K 3/42; H03K 5/14; G01J 11/00; G01R 19/00; G11C 13/04;
(Continued)

(56) References Cited

U.S. PATENT DOCUMENTS 5,056,111 A * 10/1991 Duling, III ............ H04B 10/00
                                                      398/115
5,187,449 A     2/1993 May
(Continued)

FOREIGN PATENT DOCUMENTS

CN         1564458 A      1/2005
CN       102419485 A      4/2012
(Continued)

OTHER PUBLICATIONS

First Search Report issued in counterpart Chinese Patent Application No. 202110435404.3, dated Dec. 23, 2021.
(Continued)

*Primary Examiner* — Dominic J Bologna
(74) *Attorney, Agent, or Firm* — Westbridge IP LLC

(57)     ABSTRACT

Disclosed are an ultrafast electric pulse generation and detection device and a use method thereof. The device includes a laser and an electric pulse generator. The electric pulse generator includes: a photoelectric material layer including an optically controlled switching region for responding to excitation light generated by the laser; an insulating layer formed on the photoelectric material layer, wherein a switch structure exists at a position of the insulating layer corresponding to the optically controlled switching region, so that the optically controlled switching region is partially exposed or completely exposed; transmission lines are formed on the insulating layer.

10 Claims, 4 Drawing Sheets

(51) Int. Cl.
  *G01R 19/00* (2006.01)
  *G11C 13/04* (2006.01)
  *H01S 3/067* (2006.01)
  *H01S 3/091* (2006.01)
  *H01S 3/094* (2006.01)
  *H01S 3/16* (2006.01)
  *H03K 3/42* (2006.01)
  *H03K 5/14* (2014.01)

(52) U.S. Cl.
  CPC ...... *H01S 3/0912* (2013.01); *H01S 3/094076* (2013.01); *H03K 3/42* (2013.01); *H03K 5/14* (2013.01); *H01S 3/067* (2013.01); *H01S 3/1625* (2013.01); *H01S 3/1636* (2013.01); *H01S 2302/00* (2013.01)

(58) Field of Classification Search
  CPC .. H01S 3/0912; H01S 3/094076; H01S 3/067; H01S 3/1625; H01S 3/1636; H01S 2302/00
  See application file for complete search history.

(56) References Cited

U.S. PATENT DOCUMENTS

| | | | |
|---|---|---|---|
| 5,936,732 A * | 8/1999 | Smirl | G01J 11/00 356/453 |
| 6,248,992 B1 | 6/2001 | Baca et al. | |
| 2022/0109410 A1* | 4/2022 | Tong | H03F 1/0261 |
| 2024/0106185 A1* | 3/2024 | Takahashi | G02F 1/011 |

FOREIGN PATENT DOCUMENTS

| | | |
|---|---|---|
| CN | 102810814 A | 12/2012 |
| CN | 103529261 A | 1/2014 |
| CN | 104201550 A | 12/2014 |
| CN | 105375905 A | 3/2016 |
| CN | 106646323 A | 5/2017 |
| CN | 106816495 A | 6/2017 |
| KR | 20030037203 A | 5/2003 |

OTHER PUBLICATIONS

International Search Report issued in corresponding PCT Application No. PCT/CN2021/088955, dated Dec. 23, 2021.
Supplementary Search Report issued in counterpart Chinese Patent Application No. 202110435404.3, dated Jun. 13, 2022.
Zhang, The Nano-Fabrication of Ultra Fast Photoconductive Switch, Master's Thesis submitted to Tianjin University, dated Apr. 15, 2009.
Zhao, The Pattern Design and System Research of PCSS Base on Photoconductive Sampling Measurement Method, Master's Thesis submitted to Tianjin University, dated Dec. 15, 2011.
First Office Action issued in counterpart Chinese Patent Application No. 202110435404.3, dated Dec. 23, 2021.
Second Office Action issued in counterpart Chinese Patent Application No. 202110435404.3, dated Jun. 13, 2022.

* cited by examiner

ULTRAFAST ELECTRIC PULSE GENERATION AND DETECTION DEVICE AND USE METHOD THEREOF

CROSS-REFERENCE TO RELATED APPLICATIONS

This application is a continuation of International Application No. PCT/CN2021/088955, filed on Apr. 22, 2021, the content of which is incorporated herein by reference in its entirety.

TECHNICAL FIELD

The disclosure relates to a magnetic memory technology, and in particular to an ultrafast electric pulse generation and detection device and a use method thereof.

BACKGROUND

Increasing storing and computing speed and reducing energy consumption are two major challenges in memory research. In the past two decades, femtosecond lasers have been widely used in the research of magnetic flipping and data storage of ultrafast scale specific materials. However, the integration of ultrafast optics in traditional memory field faces many problems. Therefore, ultrashort electrical pulses based on the femtosecond lasers are more conducive to the research of ultrafast and low-power memory, so as to explore new data storage methods.

For example, a new generation of nonvolatile magnetic memories is characterized by low power consumption, and the basic unit thereof is a magnetic tunnel junction which is usually composed of three thin films. One tunneling barrier layer separates two magnetic layers, one of which is a reference layer, has a large coercive field and a fixed magnetization direction, and the other of which is a free layer, has a small coercive field and a variable magnetization direction, and the magnetization direction of the free layer is parallel or anti-parallel to the magnetization direction of the reference layer, such that the magnetic tunnel junction exhibits low resistance and high resistance for storing binary data "0" and "1". By using the spin transfer torque, the magnetization flipping of the magnetic tunnel junction can be completed by a current pulse. The current pulse is polarized under the action of tunneling, so as to complete the magnetization flipping of the free layer. The magnetization flipping current based on the spin transfer torque is typically on the order of nanoseconds, this is because that a shorter current requires a larger current density, resulting in breakdown of the tunneling barrier layer. The spin-orbit moment generates a spin current by injecting a current into a heavy metal having a high spin Hall angle, so that the spin-orbit moment is used for magnetization flipping of the magnetic layer. Since the current does not pass through the tunneling barrier layer, the magnetization flipping can be achieved at a current of 200 ps. However, the limitations of the pulse generation device make it difficult for the current to enter a time scale shorter than 200 ps, which limits the speed of the magnetic memory.

SUMMARY

Based on the problems existing in the prior art, the disclosure provides an ultrafast electric pulse generation and detection device, which can generate ultrafast electrical pulses on the order of picoseconds. The ultrafast electric pulse generation and detection device includes:

a laser for generating femtosecond excitation light;
an electric pulse generator, including:
  a photoelectric material layer including an optically controlled switching region for responding to the femtosecond excitation light generated by the laser;
  an insulating layer formed on the photoelectric material layer, where a switch structure exists at a position of the insulating layer corresponding to the optically controlled switching region, and exposes the optically controlled switching region partially or completely;
  transmission lines formed on the insulating layer, where the transmission lines include a current transmission line and at least one ground signal transmission line; where the current transmission line includes a first section of current transmission line and a second section of current transmission line, the switch structure is located between the first section of current transmission line and the second section of current transmission line, and opposite ends of the first section of current transmission line and the second section of current transmission line are respectively aligned with opposite edges of the switch structure;
a voltage source connected to the first section of current transmission line, and used to output a bias voltage;
where the amplitude and polarity of an ultrafast electric pulse generated by the electric pulse generator is adjustable by adjusting the bias voltage output from the voltage source.

In an embodiment, the laser includes, but is not limit to:
a Ti Sapphire laser amplifier with repetition frequency of 1-5 kHz, pulse width of 20-250 fs and wavelength of 650-1200 nm; or
a Ti Sapphire laser oscillator with repetition frequency of 70-100 MHz, pulse width of 20-250 fs and wavelength of 650-1200 nm; or
a fiber laser with repetition frequency of 70-100 MHz, pulse width of 120-250 fs and wavelength of 1535-1565 nm.

In an embodiment, the photoelectric material layer includes, but is not limit to, a material layer including one piece of the following or a combination thereof: low temperature GaAs, GaAs, InGaAs, InGa(Al)As, InAlAs, or other III-V semiconductor materials, graphene heterojunctions, or the like, and the insulating layer includes, but is not limited to, a $SiO_2$ layer, and the transmission lines include, but is not limited to, electron beam evaporated Ti (0-50 nm)/Au (50-500 nm).

In an embodiment, when the photoelectric material layer is a low-temperature GaAs photoelectric material layer, the low-temperature GaAs photoelectric material layer includes, from bottom to top,
  GaAs (100) semi-insulating substrate, $GaAl_{0.8}As$ material layer with a thickness of 100-500 nm, GaAs material layer with a thickness of 1-10 nm and low-temperature GaAs material layer with a thickness of 0.5-5 μm;
  the $SiO_2$ insulating layer is formed on the low-temperature GaAs material layer, with a thickness of 10-200 nm.

In an embodiment, the ultrafast electric pulse generation and detection device further includes:
  a delay line for delaying part of the femtosecond excitation light generated by the laser for a preset time to generate a probe light which is focused on a probe tip of a current detection device;

where the preset time is determined according to a position of the probe tip of the current detection device on the second section of current transmission line and a time when an ultrafast electric pulse generated by the electric pulse generator reaches the position.

The disclosure further provides a method for generating an ultrafast electric pulse using the ultrafast electric pulse generation and detection device of the disclosure, the method includes:

setting a bias voltage of a voltage value within a predetermined threshold range (e.g., between ±15V) on a first section of current transmission line;

irradiating a femtosecond excitation light generated by a laser to an optically controlled switching region of a photoelectric material layer through a switching structure existed at an insulating layer to generate an ultrafast electric pulse; and outputting the ultrafast electric pulse along a second section of current transmission line;

where the method further includes:

changing a value of the bias voltage to adjust the amplitude and polarity of the ultrafast electric pulse.

The disclosure further provides a method for detecting an ultrafast electric pulse using the ultrafast electric pulse generation and detection device of the disclosure, the method includes:

placing a probe tip of a current detection device on a second section of current transmission line when an ultrafast electric pulse is generated using the ultrafast electric pulse generation and detection device;

delaying, by a delay line, part of femtosecond excitation light generated by a laser for a preset time to generate a probe light which is focused on the probe tip of the current detection device;

where the preset time is determined according to a position of the probe tip of the current detection device on the second section of current transmission line and a time when the ultrafast electric pulse reaches the position.

The ultrafast electric pulse generation and detection device of the disclosure can generate an electric pulse as low as 3.7 ps through excitation of a photoelectric material by the femtosecond excitation light, thereby realizing generation of a signal of hGHz. By using the current detection device (such as a TeraSpike probe), the ultrafast electric pulse generated by the ultrafast electric pulse generation and detection device can be detected in real time. When a laser with a wavelength of 1560 nm is used and a suitable photoelectric material and a current amplifier are provided, the ultrafast electric pulse generation and detection device of the disclosure can greatly reduce the cost of generating femtosecond laser.

BRIEF DESCRIPTION OF THE DRAWINGS

In order to more clearly explain the embodiments of the disclosure, drawings that need to be used in the description of the embodiments will be simply introduced below, obviously the drawings in the following description are merely some examples of the disclosure, for the person skilled in the art, it is also possible to obtain other drawings according to these drawings without making creative efforts.

DETAILED DESCRIPTION OF THE EMBODIMENTS

Hereinafter the technical solution in the embodiments of the disclosure will be described clearly and integrally in combination with the accompanying drawings in the embodiments of the disclosure, and obviously the described embodiments are merely part of the embodiments, not all of the embodiments. Based on the embodiments of the disclosure, all other embodiments that are obtained by the person skilled in the art without making creative efforts fall within the protection scope of the disclosure.

Figure 1:
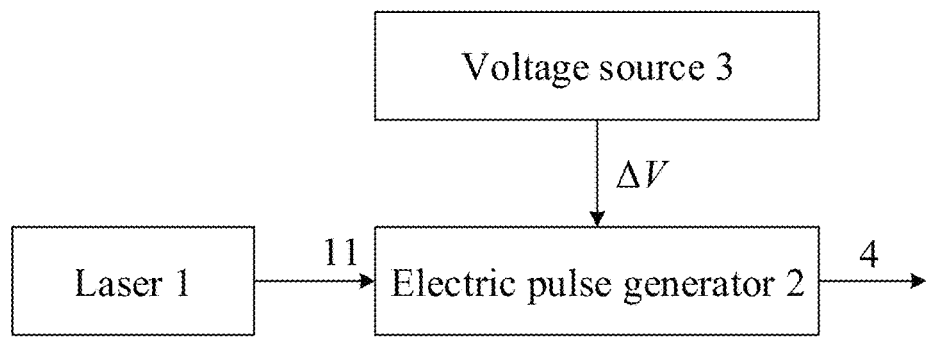
FIG. 1 is a diagram of an ultrafast electric pulse generation and detection device of the disclosure.

The disclosure provides an ultrafast electric pulse generation and detection device, which can generate ultrafast electrical pulses on the order of picoseconds. As shown in FIG. 1, the ultrafast electric pulse generation and detection device includes a laser 1, an electric pulse generator 2 and a voltage source 3. The laser 1 is used for generating femtosecond excitation light 11. The electric pulse generator 2 is used to generate an ultrafast electric pulse/current pulse 4 under the action of the femtosecond excitation light 11 generated by the laser 1. The voltage source 3 is used to supply a bias voltage $\Delta V$ to the electric pulse generator 2.

Figure 2:
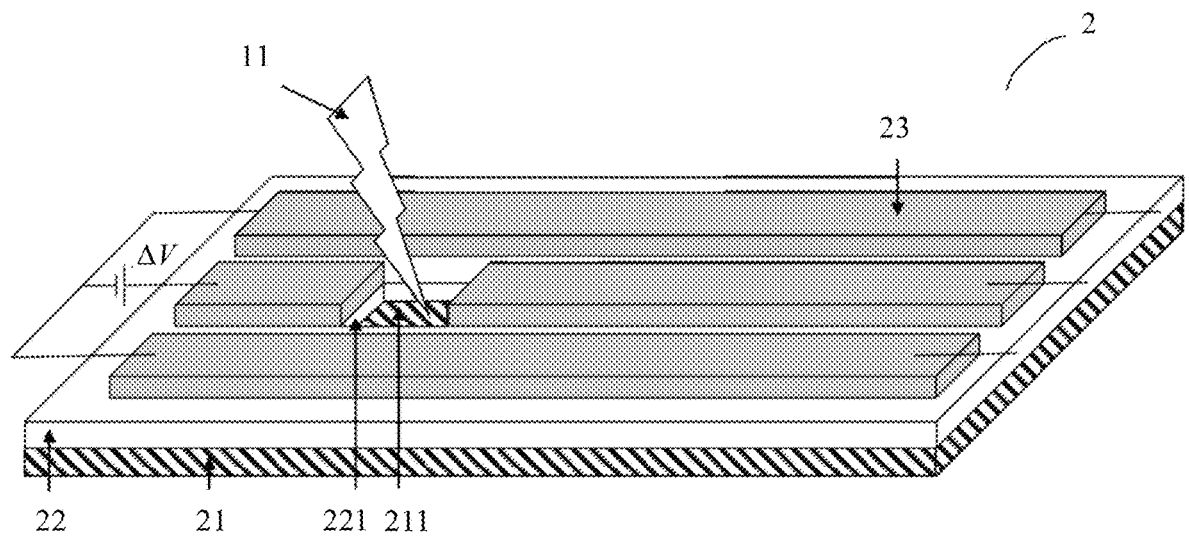
FIG. 2 is a diagram of an electric pulse generator in the ultrafast electric pulse generation and detection device.

The structure of the electric pulse generator 2 is shown in FIG. 2. The electric pulse generator 2 specifically includes a photoelectric material layer 21, an insulating layer 22 and transmission lines 23. The photoelectric material layer 21 includes an optically controlled switching region 211 for responding to the femtosecond excitation light 11 generated by the laser 1; the insulating layer 22 is formed on the photoelectric material layer 21, a switch structure 221 exists at a position of the insulating layer 22 corresponding to the optically controlled switching region 211, and exposes the optically controlled switching region 211 partially or completely. The disclosure is described by taking an example that the switch structure 221 is square, and in this case, the optically controlled switching region 211 is completely exposed. In practical applications, the shape of the switch structure 221 may also be a comb shape, a logarithmic period shape, a spiral shape, etc., and at those case, the optically controlled switching region 211 is partially exposed; the switch structure 221 may also be replaced by a photoconductive antenna structure. The transmission lines 23 are formed on the insulating layer 22, and the transmission lines 23 are coplanar waveguide transmission lines.

Figure 3:
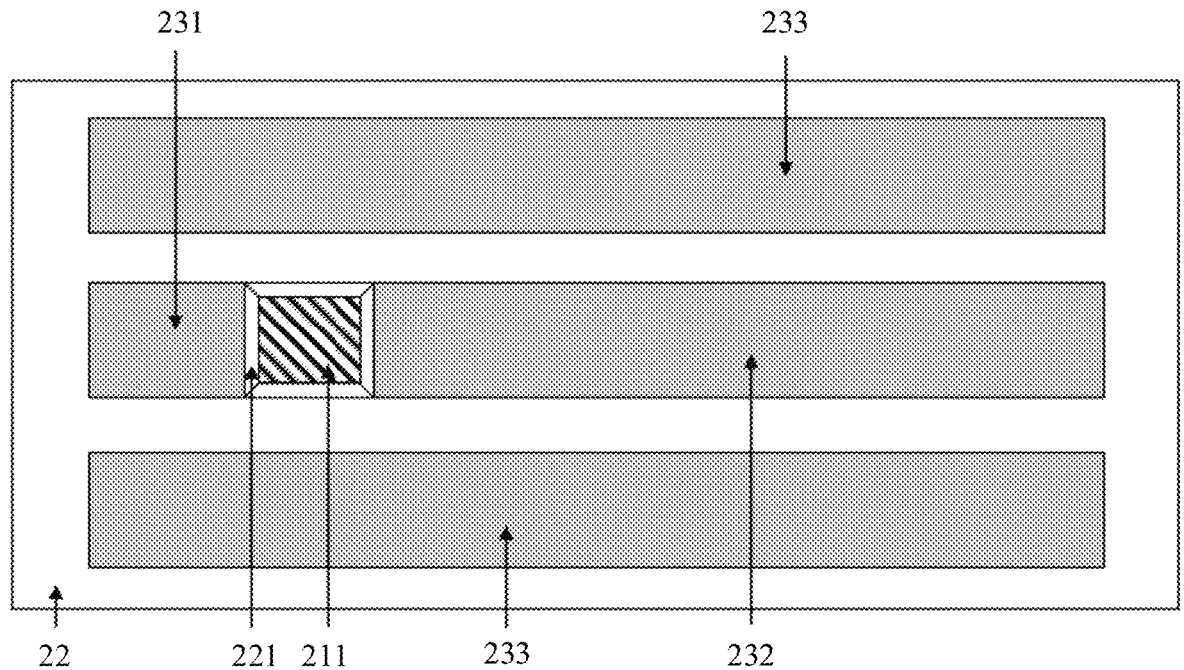
FIG. 3 is a diagram of an insulating layer and transmission lines of the electric pulse generator.

The specific structures of the transmission lines 23 are shown in FIG. 3. The transmission lines 23 include a current transmission line, the current transmission line includes a first section of current transmission line 231 and a second section of current transmission line 232. The switch structure 221 is located between the first section of current transmission line 231 and the second section of current transmission line 232, and opposite ends of the first section of current transmission line 231 and the second section of current transmission line 232 are respectively aligned with opposite edges of the switch structure 221, such that the switch structure 221 is not obscured by the transmission lines 23. The transmission lines 23 further include at least one ground signal transmission line 233, and in general, the number of the ground signal transmission line(s) is one or two. When there are two ground signal transmission lines, the current transmission line is located between the two ground signal transmission lines. FIG. 3 is merely an example of transmission lines according to the disclosure. In practical application, the lengths of the first section of current transmission line 231 and the second section of current transmission line 232 can be adaptively adjusted according to actual requirements, and the disclosure is not limited thereto.

In practical application, the photoelectric material layer 21 includes, but is not limit to, a material layer comprising one piece of the following or a combination thereof: low temperature GaAs, GaAs, InGaAs, InGa(Al)As, InAlAs, or other III-V semiconductor materials, graphene heterojunctions, or the like. These materials are characterized by low carrier lifetime, high carrier mobility, appropriate energy gap, high breakdown voltage, large dark resistance and the like.

In the disclosure, for example, a low-temperature GaAs photoelectric material layer can be used as the photoelectric material layer 21. The low-temperature GaAs photoelectric material layer consists of, from bottom to top, GaAs(100) semi-insulating substrate, $GaAl_{0.8}As$ material layer with a thickness of 100-500 nm, GaAs material layer with a thickness of 1-10 nm and low-temperature GaAs material layer with a thickness of 0.5-5 μm. The low-temperature GaAs has a good response to excitation light at 800 nm wavelength. In an example, the bottommost layer of the photoelectric material layer 21 is a GaAs (100) semi-insulating substrate on which $GaAl_{0.8}As$ material layer with a thickness of 300 nm, GaAs material layer with a thickness of 5 nm and low-temperature GaAs material layer with a thickness of 1 μm are sequentially grown. Among them, $GaAl_{0.8}As$ is grown at a high temperature of 550° C.; the low-temperature GaAs is grown at 260° C. and As/Ga pressure ratio of 50. The photoelectric material layer 21 may be formed by molecular beam epitaxy (MBE) process.

The insulating layer 22 may be a $SiO_2$ material layer with a thickness of 10-200 nm, for example 100 nm. When making the insulating layer, $SiO_2$ material layer with a thickness of 100 nm can be grown on the low-temperature GaAs material layer of the photoelectric material layer 21 by magnetron sputtering process, which ensures good insulation between the low-temperature GaAs material layer and the transmission lines 23 located on the insulating layer 22, thereby reducing leakage current. The switch structure 221 on the insulating layer 22 can be fabricated by using ultraviolet (UV) exposure and etching technology. In an embodiment, the transmission lines 23 is an electron beam evaporated Ti (0-50 nm)/Au (50-500 nm), such as Ti (20 nm)/Au (300 nm).

The thicknesses and materials of the photoelectric material layer and the insulating layer described above are one example given in the disclosure. In practical application, the materials and thicknesses of the photoelectric material layer, the insulating layer and the transmission line can be adjusted according to requirement, and the disclosure is not limit thereto.

In the actual manufacturing process of the electric pulse generator 2, the photoelectric material layer 21 may first be formed as described above, and then the insulating layer 22 having a suitable thickness may be grown on the photoelectric material layer 21. At this time, there is no switch structure on the insulating layer 22, and then a continuous current transmission line and at least one continuous ground signal transmission line are evaporated on the insulating layer 22 by an electron beam. Subsequently, the continuous current transmission line is cut off from a certain position by the UV exposure and etching technology, and then the continuous current transmission line becomes the first section of current transmission line 231 and the second section of current transmission line 232 which are not connected to each other. Then, the portion of the insulating layer exposed after the current transmission line is cut off is etched by the UV exposure and etching technology to form a switch structure 221. The switch structure 221 partially or completely exposes the optically controlled switching region 211 on the photoelectric material layer 21, so that the optically controlled switching region 211 can receive the femtosecond excitation light irradiated by the laser 1.

The voltage source 3 may be a keithley 2400 voltage source. The first electrode of the voltage source 3 is connected to the first section of current transmission line 231 through a probe, and the second electrode of the voltage source 3 is connected to the ground signal transmission line 233 through probe(s), to provide a bias voltage $\Delta V$ of a voltage value within a predetermined threshold range (e.g., between ±15V). When the optically controlled switch 211 generates the ultrafast electric pulse/current pulse 4 on the order of picoseconds under the action of the excitation light 11, the amplitude and polarity of the ultrafast electric pulse/current pulse 4 can be adjusted by changing the value of the bias voltage $\Delta V$.

When the femtosecond excitation light 11 generated by the laser 1 is irradiated on the optically controlled switching region 211, the optically controlled switching region 211 generates a photocurrent, that is, a transient ultrafast electric pulse/current pulse 4 on the order of picoseconds, and the pulse width or signal strength of the ultrafast electric pulse/current pulse 4 may be improved under the action of the bias voltage $\Delta V$. Due to the semiconductor properties of the photoelectric material layer 21 (GaAs) and the insulating properties of the insulating layer 22 ($SiO_2$), the ultrafast electric pulse/current pulse 4 will be guided and transmitted along the second section of current transmission line 232. The amplitude and polarity of the ultrafast electric pulse/current pulse 4 can be adjusted by changing the value of the bias voltage $\Delta V$. In addition, the relationship between the injected optical power of the laser 1 and size of the semiconductor bandgap energy determines whether the photocurrent is generated in the optically controlled switching region 211 as well as the intensity of the generated photocurrent.

The type of the laser 1 includes, but is not limited to, a Ti Sapphire laser amplifier with repetition frequency of 1-5 kHz, pulse width of 20-250 fs and wavelength of 650-1200 nm; a Ti Sapphire laser oscillator with repetition frequency of 70-100 MHz, pulse width of 20-250 fs and wavelength of 650-1200 nm; and a fiber laser with repetition frequency of 70-100 MHz, pulse width of 120-250 fs or wavelength of 1535-1565 nm, and the like.

In practical application, the laser 1 may be a Ti Sapphire laser amplifier with repetition frequency of 5 kHz, pulse width of 30 fs and wavelength of 800 nm. An excitation light with a pulse width of 250 fs of 30 mW (single pulse energy of 0.37 nJ) is irradiated to the optically controlled switching region to generate a photocurrent signal with a pulse width of 6 ps. The laser 1 may also be a Ti Sapphire laser oscillator with repetition frequency of 80 MHz, pulse width of 250 fs and wavelength of 780 nm. An excitation light with a pulse width of 30 fs of 1.5 mW (single pulse energy of 0.3 μJ) is irradiated to the optically controlled switching region to generate a photocurrent signal with a pulse width of 3.7 ps. The laser 1 may also be a fiber laser with repetition frequency of 80 MHz, pulse width of 120 fs and wavelength of 1560 nm. An excitation light with a pulse width of 120 fs of 1 W (single pulse energy of 12.5 nJ) is irradiated to the optically controlled switching region, and at this time, the photoelectric material layer can be InGa(Al)As material layer.

The type of the laser includes, but is not limited to, a titanium sapphire femtosecond laser or a fiber femtosecond laser. When the type of the laser 1 changes (mainly in form of a change in output wavelength), the photoelectric material layer 21 of the electric pulse generator 2 can be replaced accordingly. For example, in order to match a fiber laser with a wavelength of 1560 nm, material such as InGa(Al)As can be used as the photoelectric material layer, and picosecond electric pulse can also be generated at this time. The above shows only a few examples of the lasers given in the disclosure, and the disclosure is not limited thereto.

At an end of the second section of current transmission line 232 that is remote from the switch structure 221, the ultrafast electric pulse/current pulse 4 can be transmitted to other transmission lines or apparatuses by means of on-chip, "probe-coaxial-probe" and "probe bridging", for subsequent application of the ultrafast electric pulse/current pulse 4. The amplitude of ultrafast electric pulse/current pulse 4 can also be amplified by using an amplifier with a wide bandwidth.

Figure 4A:
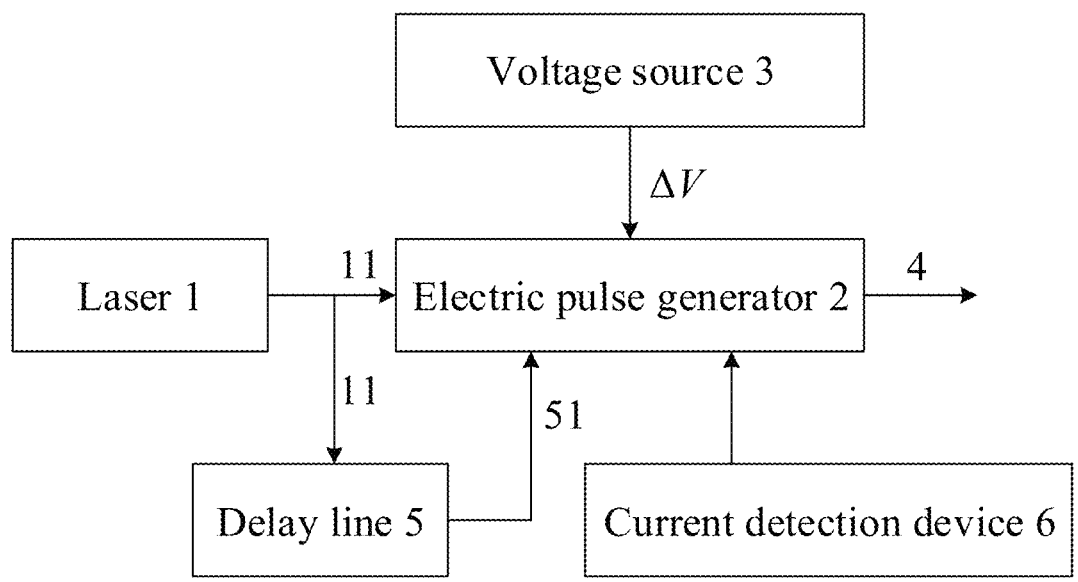
FIGS. 4A and 4B are diagrams of detecting the electric pulse generated by the ultrafast electric pulse generation and detection device.
Figure 4B:
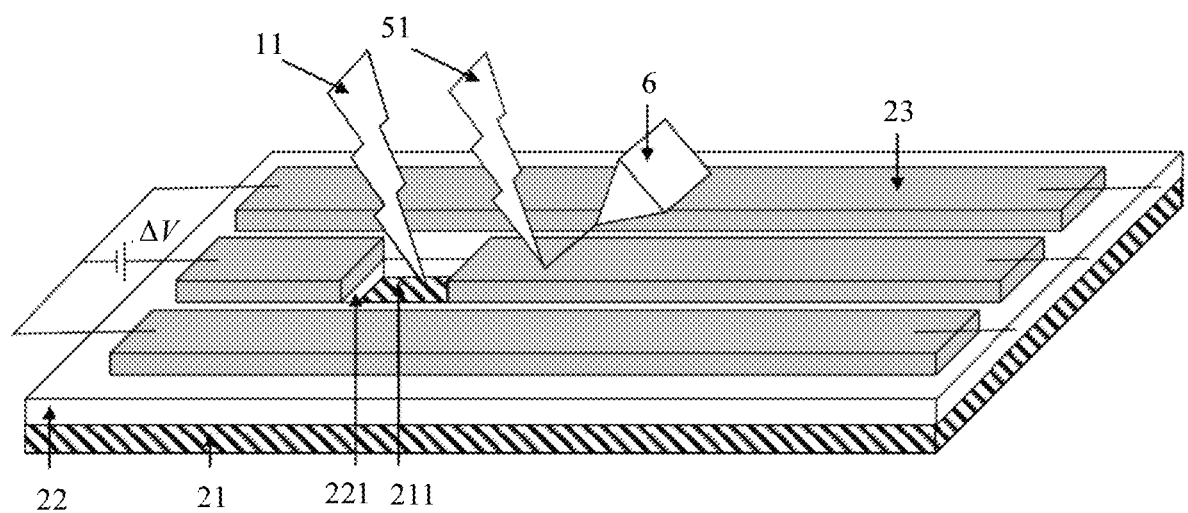

In an embodiment, as shown in FIGS. 4A and 4B, the ultrafast electric pulse generation and detection device further includes a delay line 5 and a current detection device 6.

The delay line 5 is used for delaying part of the femtosecond excitation light 11 generated by the laser 1 for a preset time to generate probe light 51, and the probe light 51 is focused on the probe tip of the current detection device 6. The probe tip of the current detection device 6 is located at a position of the second section of current transmission line 232, for detecting the width of the ultrafast electric pulse/current pulse at the position.

The preset time is determined according to the position of the probe tip of the current detection device on the second section of current transmission line and the time when the ultrafast electric pulse/current pulse reaches the position. The probe light 51 generated by the delay line 5 is used to trigger the current detection device 6 for ultrafast electric pulse/current pulse detection. Specifically, part of the femtosecond excitation light 11 generated by the laser 1 is delayed by the delay line 5 for a preset time to generate the probe light 51, and the probe light 51 is irradiated on the probe tip of the current detection device 6 located on the second section of current transmission line 232.

Since the ultrafast electric pulse/current pulse 4 is generated and transmitted along the second section of current transmission line 232 at the speed v, it will reach different positions of the second section of current transmission line 232 at different times. For a certain position, the maximum and most accurate current value is detected at the time when the current reaches the position, while the current value detected before or after the time when the current reaches the position is lower than its maximum value. Thus, when the ultrafast electric pulse/current pulse 4 has just reached the position of the probe tip of the current detection device 6, and the current detection device 6 is triggered by the probe light 51 at the same time, the maximum and most accurate ultrafast electric pulse/current pulse can be detected. An instantaneous electric field signal generated by the probe light 51 induces a change in the ultrafast electric pulse/current pulse 4, which can be measured by means of a lock-in amplifier.

Figure 5:
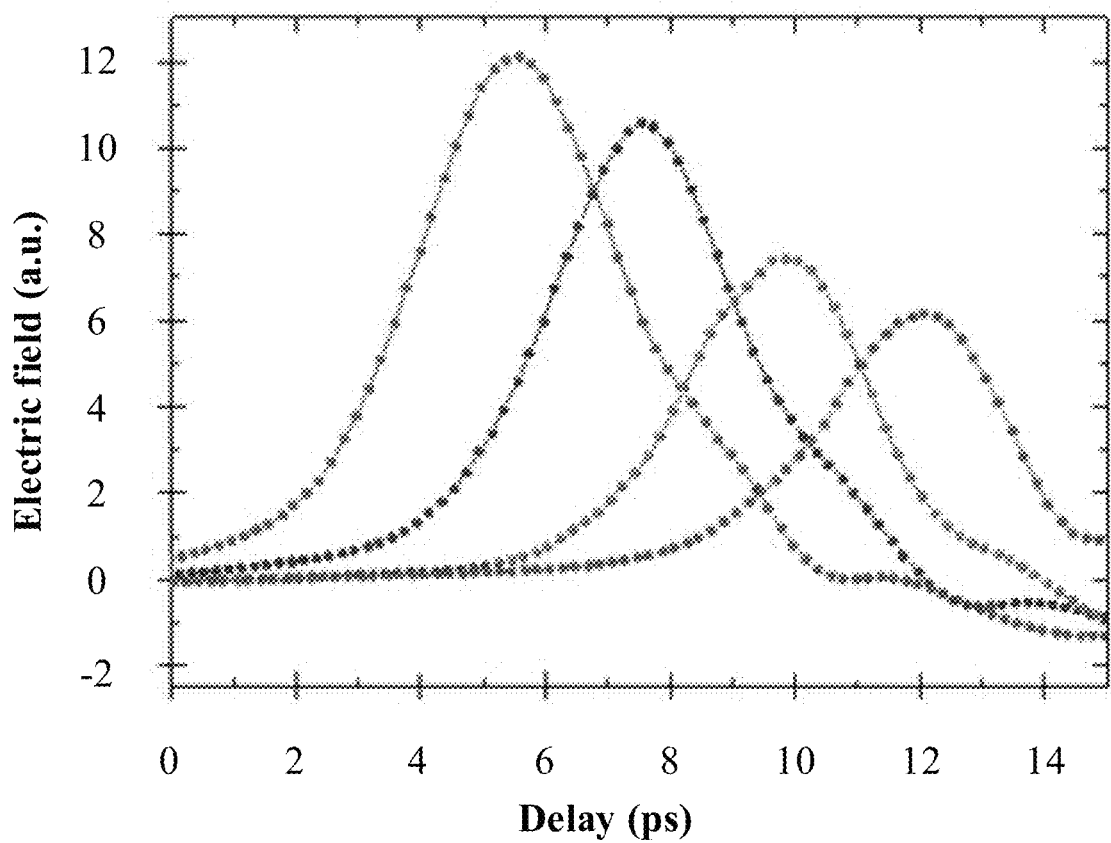
FIG. 5 is a waveform diagram of ultrafast electric pulses measured at different positions by the current detection device.

The waveform diagram of the ultrafast electric pulses/current pulses detected at different positions on the second section of current transmission line 232 using the current detection device 6 is shown in FIG. 5. Curves (a) to (d) in FIG. 5 show the ultrafast electric pulses/current pulses at different timings of the current transmission, respectively. For any of the curves, the value of the measured ultrafast electric pulse/current pulse is the maximum when delay time of the excitation light 11 coincides with the time of the current transmission; when the delay time of the excitation light 11 is more or less than the current transmission time, the values of the measured ultrafast electric pulse/current pulse are all lower than the maximum value. In other words, since the delay time of the excitation light 11 corresponds to the detection time of the current detection device 6, and the ultrafast electric pulse/current pulse is transmitted to different positions at different timings, therefore, when the ultrafast electric pulse/current pulse 4 also reaches the position of the probe tip of the current detection device 6 when the current detection device 6 performs detection, the maximum value of the ultrafast electric pulse/current pulse can be detected.

The ultrafast electric pulse generation and detection device of the disclosure can generate an electric pulse as low as 3.7 ps through excitation of a photoelectric material by the femtosecond excitation light, thereby realizing generation of a signal of hGHz. Meanwhile, by using the current detection device (such as a TeraSpike probe), the ultrafast electric pulse generated by the ultrafast electric pulse generation and detection device can be detected in real time. When a laser with a wavelength of 1560 nm is used and a suitable photoelectric material and a current amplifier are provided, the ultrafast electric pulse generation and detection device of the disclosure can greatly reduce the cost of generating femtosecond laser.

Figure 6:
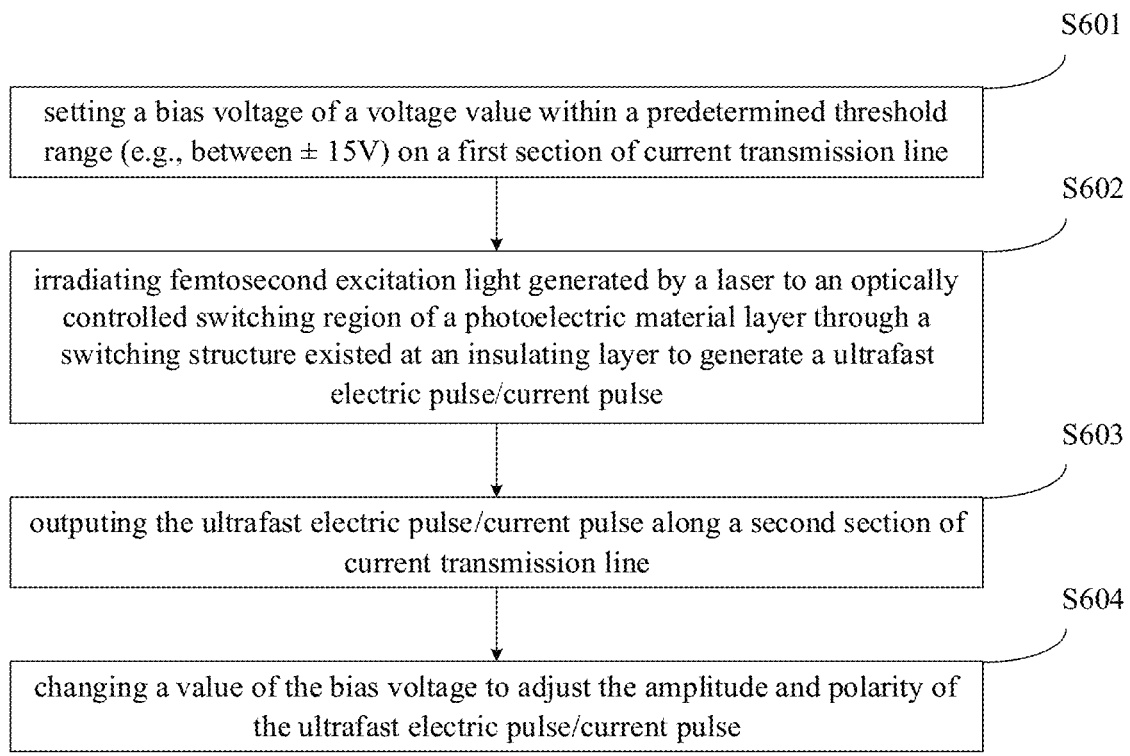
FIG. 6 is a flow chart of generating an ultrafast electric pulse using the ultrafast electric pulse generation and detection device of the disclosure.

Another embodiment of the disclosure further provides a method for generating an ultrafast electric pulse using the ultrafast electric pulse generation and detection device of the disclosure, as shown in FIG. 6, the method includes:

S601, setting a bias voltage of a voltage value within a predetermined threshold range (e.g., between ±15V) on a first section of current transmission line;

S602, irradiating femtosecond excitation light generated by a laser to an optically controlled switching region of a photoelectric material layer through a switching structure existed at an insulating layer to generate a ultrafast electric pulse/current pulse;

S603, outputting the ultrafast electric pulse/current pulse along a second section of current transmission line;

S604, changing a value of the bias voltage to adjust the amplitude and polarity of the ultrafast electric pulse/current pulse.

The embodiment gives the method for generating an ultrafast electric pulse using the ultrafast electric pulse generation and detection device of the disclosure, by which electric pulse as low as 3.7 ps can be generated.

Figure 7:
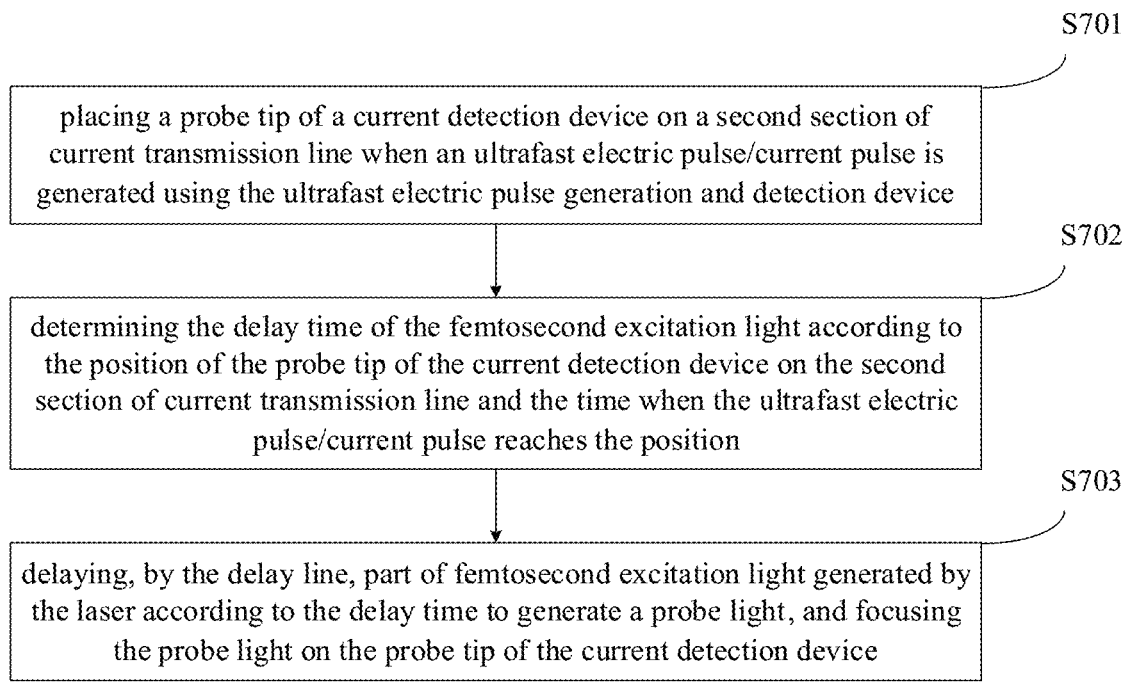
FIG. 7 is a flow chart of detecting an ultrafast electric pulse using the ultrafast electric pulse generation and detection device of the disclosure.

Another embodiment of the disclosure further provides a method for detecting an ultrafast electric pulse using the ultrafast electric pulse generation and detection device of the disclosure, as shown in FIG. 7, the method includes:

S701, placing a probe tip of a current detection device on a second section of current transmission line when an ultrafast electric pulse/current pulse is generated using the ultrafast electric pulse generation and detection device;

S702, determining the delay time of the femtosecond excitation light according to the position of the probe tip of the current detection device on the second section of current transmission line and the time when the ultrafast electric pulse/current pulse reaches the position;

S703, delaying, by the delay line, part of femtosecond excitation light generated by the laser according to the delay time to generate a probe light, and focusing the probe light on the probe tip of the current detection device.

The instantaneous electric field signal generated by the probe light may induce a change in the ultrafast electric pulse/current pulse, the ultrafast electric pulse/current pulse can thus be measured using a current detection device, such as a TeraSpike probe.

In this embodiment, by using the current detection device, the ultrafast electric pulse generated by the ultrafast electric pulse generation and detection device can be detected in real time.

The various embodiments in the specification are described in a progressive manner, and the same or similar parts between the various embodiments may be referred to each other, and each embodiment focuses on the differences from the other embodiments. In the description, reference terms "one embodiment", "some embodiments", "example", "specific example" or "some examples" are used to mean that specific features, structures, materials or characteristics described by combining the embodiment or example are included in at least one embodiment or example in the embodiments of the present specification.

In the present specification, exemplary expression of the above terms does not necessarily refer to the same embodiment or example. Furthermore, those skilled in the art can combine different embodiments or examples described in the present specification and features of the different embodiments or examples in the case that they are not contradictory to each other. The above description is merely an example of the embodiment of the present specification, and is not intended to limit the embodiment of the present specification. Various amendments and variations may be made to the embodiments of the present specification by those skilled in the art. Any amendments, equivalents, improvements, etc. made within the spirit and scope of the embodiment of the present specification are intended to be included within the scope of the claims of the disclosure.

What is claimed is:

1. An ultrafast electric pulse generation and detection device, comprising:
    a laser for generating femtosecond excitation light;
    an electric pulse generator, comprising:
        a photoelectric material layer comprising an optically controlled switching region for responding to the femtosecond excitation light generated by the laser;
        an insulating layer formed on the photoelectric material layer, wherein a switch structure exists at a position of the insulating layer corresponding to the optically controlled switching region, and exposes the optically controlled switching region partially or completely;
        transmission lines formed on the insulating layer, the transmission lines comprise a current transmission line and at least one ground signal transmission line; wherein the current transmission line comprises a first section of current transmission line and a second section of current transmission line, the switch structure is located between the first section of current transmission line and the second section of current transmission line, and opposite ends of the first section of current transmission line and the second section of current transmission line are respectively aligned with opposite edges of the switch structure;
    a voltage source connected to the first section of current transmission line, and used to output a bias voltage.

2. The device according to claim 1, wherein
the amplitude and polarity of an ultrafast electric pulse generated by the electric pulse generator is adjustable by adjusting the bias voltage output from the voltage source.

3. The device according to claim 2, wherein the laser is:
a Ti Sapphire laser amplifier with repetition frequency of 1-5 kHz, pulse width of 20-250 fs and wavelength of 650-1200 nm; or
a Ti Sapphire laser oscillator with repetition frequency of 70-100 MHz, pulse width of 20-250 fs and wavelength of 650-1200 nm; or
a fiber laser with repetition frequency of 70-100 MHz, pulse width of 120-250 fs and wavelength of 1535-1565 nm.

4. The device according to claim 3, wherein
the photoelectric material layer is a material layer comprising one piece of the following or a combination thereof: low-temperature GaAs, GaAs, InGaAs, InGa(Al)As or InAlAs;
the insulating layer is a $SiO_2$ material layer;
the transmission lines are an electron beam evaporated Ti(0-50 nm)/Au(50-500 nm).

5. The device according to claim 4, wherein
the photoelectric material layer is a low-temperature GaAs photoelectric material layer, and the low-temperature GaAs photoelectric material layer comprises, from bottom to top,
GaAs (100) semi-insulating substrate, $GaAl_{0.8}As$ material layer with a thickness of 100-500 nm, GaAs material layer with a thickness of 1-10 nm and low-temperature GaAs material layer with a thickness of 0.5-5 μm.

6. The device according to claim 5, wherein
the $SiO_2$ material layer is formed on the low-temperature GaAs material layer, with a thickness of 10-200 nm.

7. The device according to claim 1, wherein the device further comprises:
a delay line for delaying part of the femtosecond excitation light generated by the laser for a preset time to generate a probe light which is focused on a probe tip of a current detection device;
wherein the preset time is determined according to a position of the probe tip of the current detection device on the second section of current transmission line and a time when an ultrafast electric pulse generated by the electric pulse generator reaches the position.

8. A method for generating an ultrafast electric pulse, the method using the ultrafast electric pulse generation and detection device according to claim 1, comprising:
setting a bias voltage of a voltage value within a predetermined threshold range on a first section of current transmission line;

irradiating femtosecond excitation light generated by a laser to an optically controlled switching region of a photoelectric material layer through a switching structure existed at an insulating layer to generate an ultrafast electric pulse; and outputting the ultrafast electric pulse along a second section of current transmission line.

9. The method according to claim 8, further comprising:

changing a value of the bias voltage to adjust the amplitude and polarity of the ultrafast electric pulse.

10. A method for detecting an ultrafast electric pulse, the method using the ultrafast electric pulse generation and detection device according to claim 1, comprising:

placing a probe tip of a current detection device on a second section of current transmission line when an ultrafast electric pulse is generated using the ultrafast electric pulse generation and detection device;

delaying, by a delay line, part of femtosecond excitation light generated by a laser for a preset time to generate a probe light which is focused on the probe tip of the current detection device;

wherein the preset time is determined according to a position of the probe tip of the current detection device on the second section of current transmission line and a time when the ultrafast electric pulse reaches the position.

* * * * *